United States Patent [19]

Dunne

[11] Patent Number: 5,790,244
[45] Date of Patent: Aug. 4, 1998

[54] PRE-BIASING TECHNIQUE FOR A TRANSISTOR BASED AVALANCHE CIRCUIT IN A LASER BASED DISTANCE MEASUREMENT AND RANGING INSTRUMENT

[75] Inventor: Jeremy G. Dunne, Littleton, Colo.

[73] Assignee: Laser Technology, Inc., Englewood, Colo.

[21] Appl. No.: 702,365

[22] Filed: Aug. 23, 1996

[51] Int. Cl.$^6$ ........................................... G01C 3/08
[52] U.S. Cl. ..................... 356/5.01; 327/314; 327/325; 250/214 R
[58] Field of Search ..................... 356/5.01–5.09; 327/514, 314, 325; 250/214 R, 214 LA

[56] References Cited

U.S. PATENT DOCUMENTS

| | | | |
|---|---|---|---|
| 5,548,112 | 8/1996 | Nakase et al. | 250/214 R |
| 5,578,815 | 11/1996 | Nakase et al. | 327/514 X |
| 5,652,651 | 7/1997 | Dunne | 356/5.01 |

*Primary Examiner*—Joseph L. Felber
*Attorney, Agent, or Firm*—James A. Pinto; William J. Kubida; Holland & Hart LLP

[57] ABSTRACT

A pre-biasing technique for a transistor-based avalanche circuit which improves the initial rate of rise in the current applied through a laser diode or other light emitting device in a laser based distance measurement and ranging instrument and, therefore, the sharpness of the leading edge of the laser pulse produced. Since the timing of the flight time of a laser pulse to a target and back to the ranging instrument is determined with reference to the leading edge of the emitted laser pulse, the inherent precision obtainable is enhanced by the production of a sharper leading edge pulse. Through the use of the pre-biasing technique disclosed, the very rapid rise time pulse which may be achieved also allows for the substitution of a much cheaper light emitting diode in lieu of a conventional laser diode in an alternative implementation of a light pulsed-based distance measuring and ranging instrument.

11 Claims, 2 Drawing Sheets

PRE-BIASING TECHNIQUE FOR A TRANSISTOR BASED AVALANCHE CIRCUIT IN A LASER BASED DISTANCE MEASUREMENT AND RANGING INSTRUMENT

CROSS REFERENCE TO RELATED APPLICATION

The present invention is related to that disclosed and claimed in U.S. patent application Ser. No. 08/701,426 for "High Efficiency Voltage Conversion Circuit for a Laser Based Distance Measurement and Ranging Instrument" filed concurrently herewith and U.S. Pat. No. 5,359,404 for "Laser-Based Speed Measuring Device", both assigned to the assignee of the present invention, Laser Technology, Inc., Englewood, Colo., the disclosure of which are hereby specifically incorporated by this reference.

BACKGROUND OF THE INVENTION

The present invention relates, in general, to the field of distance or range measuring equipment. More particularly, the present invention relates to a pre-biasing technique for a transistor-based avalanche circuit of particular utility in the implementation of a laser based range finder which may be inexpensively produced yet provides highly accurate precision range measurements.

Laser based distance and range measuring equipment have been used for a number of years to provide extremely accurate distance measurements to a remote target or object. A representative instrument is the Criterion™ 100 laser range finder developed and marketed by Laser Technology, Inc., assignee of the present invention. Although a highly accurate and reliable device, its great distance ranging capability and inherent complexity translates to a manufacturing cost and form factor most suitable only for certain specific applications. Distances are determined by calculating the time of flight of a laser pulse from the instrument to the target and back and this elapsed time measurement is referenced with respect to a signal from an optical pick-up sensor mounted in the laser transmission path. This is a relatively expensive and complex mechanical and electrical technique suitable for this particular implementation and necessitated by the vagaries of temperature and drive current in firing a laser diode using a relatively costly MOSFET driver circuit.

A need therefore exists for a laser based range finder which can be economically manufactured as a light weight, rugged and compact unit to nevertheless provide extremely accurate distance measurement capabilities across a wide range of potential applications.

SUMMARY OF THE INVENTION

Disclosed herein is a pre-biasing technique for a transistor based avalanche circuit which improves the initial rate of rise in the current applied through a laser diode in a laser based distance measurement and ranging instrument and, therefore, the sharpness of the leading edge of the laser pulse produced. Since the timing of the flight time of a laser pulse to a target and back to the ranging instrument is determined with reference to the leading edge of the emitted laser pulse, the inherent precision obtainable is enhanced by the production of a sharper leading edge pulse. Through the use of the pre-biasing technique disclosed, the very rapid rise-time pulse which may be achieved also allows for the substitution of a much cheaper light emitting diode ("LED", on the order of $0.60–$0.70 each) in lieu of a conventional laser diode (on the order of $7.00 each or more) in an alternative implementation of a broader beam light pulsed-based distance measuring and ranging instrument.

Through the utilization of the technique herein disclosed, the time of flight of a laser or LED optical pulse in a distance measurement or ranging instrument may be referenced with respect to the electrical current pulse that is applied through the emitting diode as measured by the forward voltage across it. By appropriate pulse shaping and signal conditioning the actual diode driving current can be utilized as the instrument reference pulse for the time of flight timing circuit in lieu of an optical pick-up mounted in the signal emitter path since the interrelationship between the drive current and the optical emission is very close and consistently controlled.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
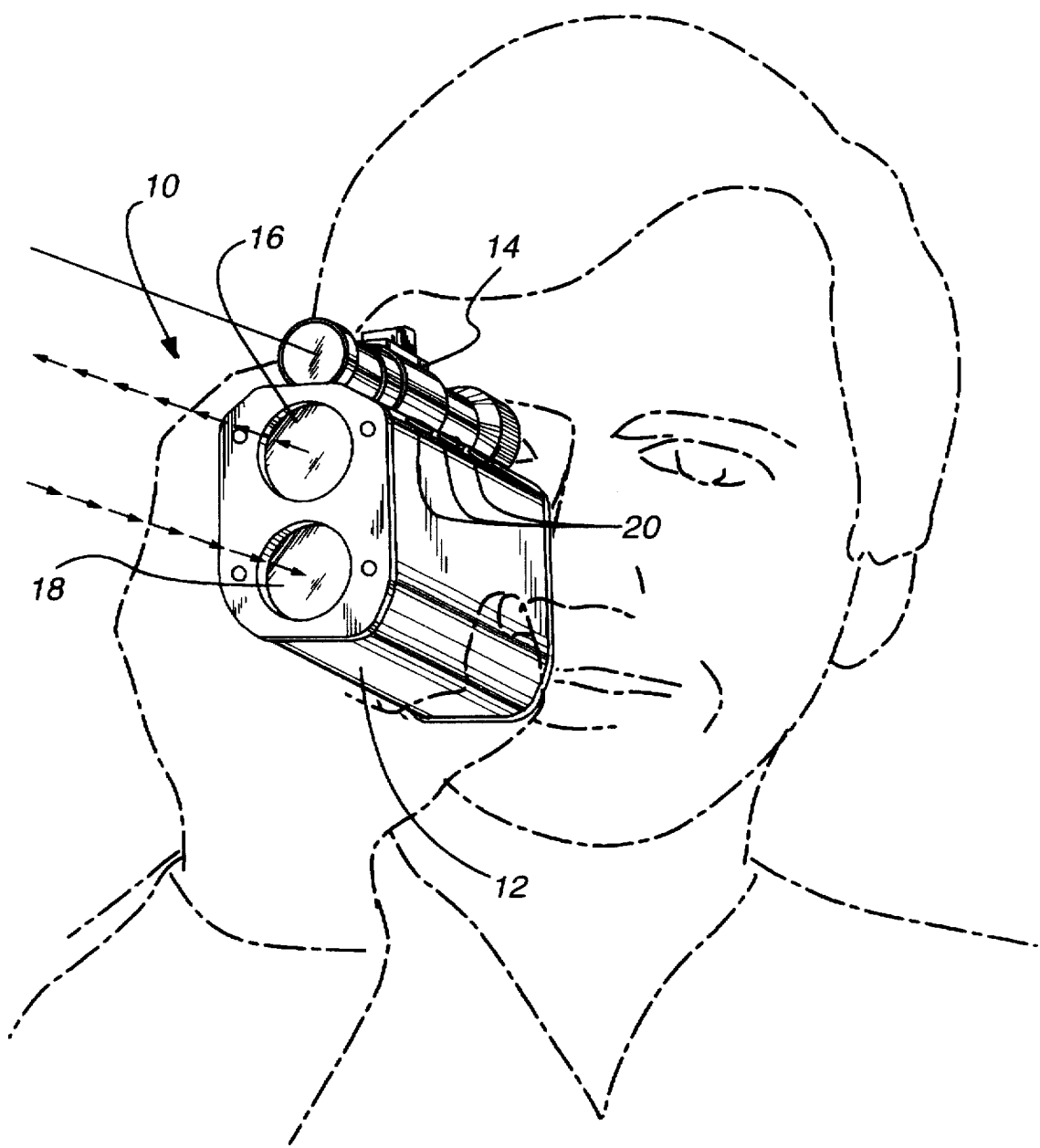
FIG. 1 is a perspective view of a representative laser based distance measurement and ranging instrument in accordance with a particular application of the pre-biasing technique for a transistor avalanche circuit of the present invention.

With reference now to FIG. 1, a laser based distance measurement and ranging instrument 10 is shown representing a possible application of a pre-biasing technique for a transistor-based avalanche circuit in accordance with the present invention as will be more fully described hereinafter. The instrument 10 includes, in pertinent part, a housing 12 which is capable of being held in one hand of a user while sighting a target substantially as illustrated. The housing 12 encloses the electronic and optical components of the instrument 10 inclusive of the battery based power source.

An instrument sight 14 (which may include a sighting reticle with a head-up display including alphanumeric or graphic representations of distances to a remote object) may be affixed to an upper portion of the housing 12 to enable a user to aim the instrument 10 towards a desired target. A signal transmitting aperture 16 and adjacent reflected signal receiving aperture 18 respectively allow for the transmission and reception of signals to enable the instrument 10 to accurately determine distances to a target from which the transmitted signal is reflected back to the instrument 10 by calculation of the signal time-of-flight. A plurality of selection switches 20, (which, in the embodiment shown, may be duplicated at two locations on the housing 12 so as to be readily accessible in either right-handed or left-handed modes of operation) allow a user to select particular features or operating modes of the instrument 10.

Figure 2:
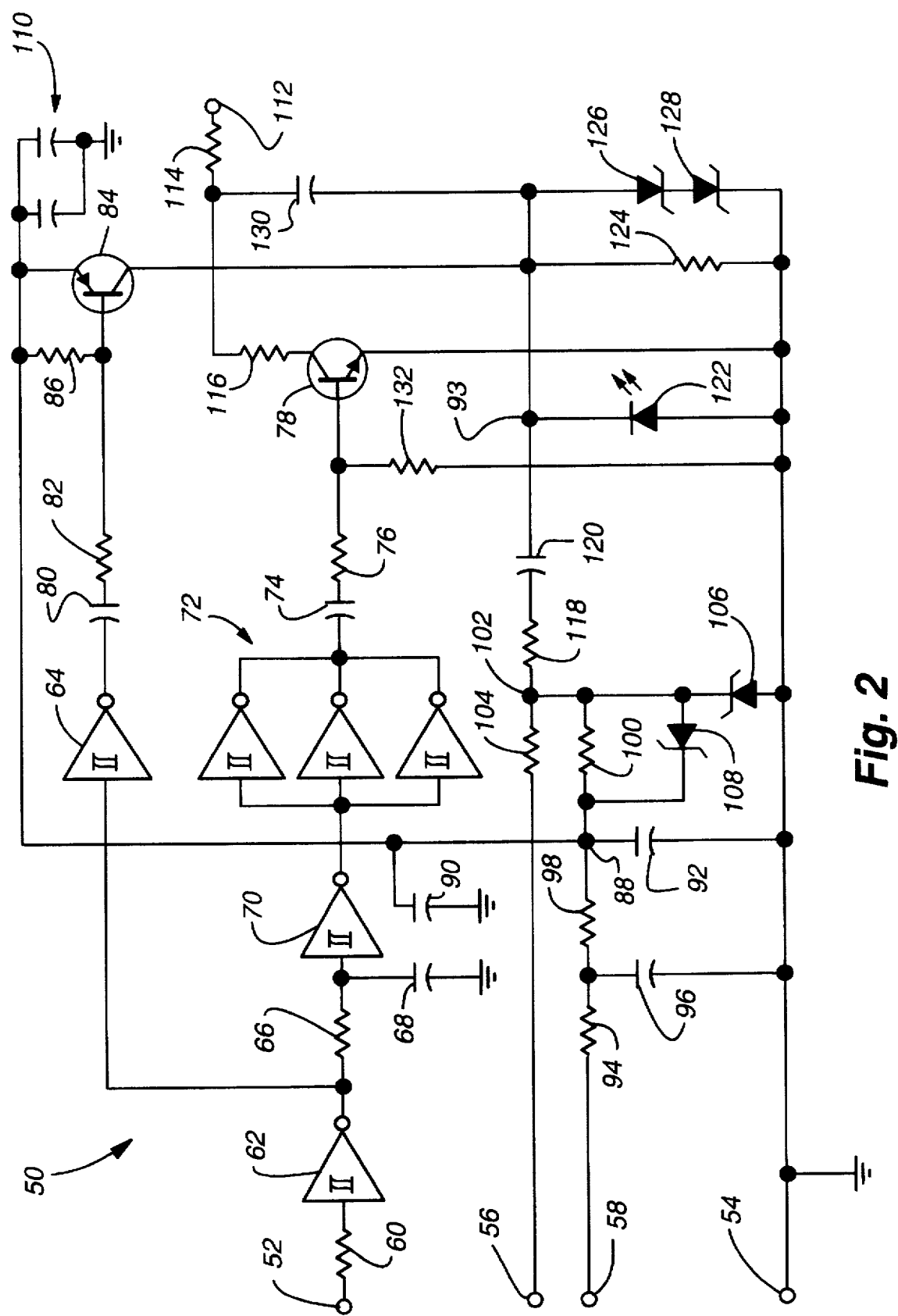
FIG. 2 is a detailed schematic illustration of a particular embodiment of circuit implementing a pre-biasing technique for a transistor avalanche circuit in accordance with the present invention of particular utility in implementing a low cost, light weight laser based distance measurement and ranging instrument as depicted in FIG. 1.

With reference additionally now to FIG. 2, a pre-biasing circuit 50 including a transistor avalanche circuit is shown.

The pre-biasing circuit 50 comprises a series of inputs 52, 54, 58 and a high voltage input 112. Node 56 is a timing reference output otherwise utilized by a the ranging device. Input 52 is coupled through a resistor 60 to one Schmitt trigger inverter 62 which, in turn, has an output thereof coupled to an input of an additional Schmitt trigger inverter 64. The output of Schmitt trigger inverter 62 is coupled through a resistor 66 to another Schmitt trigger inverter 70, and to circuit ground through a capacitor 68. The output of Schmitt trigger inverter 70 is coupled to the inputs of three Schmitt trigger inverters 72 having their outputs coupled together as shown. In a preferred embodiment, the Schmitt trigger inverters 62, 64, 70 and 72 may be conveniently furnished as portions of an extremely fast 74AC14 hex Schmitt trigger integrated circuit. The resistor 60 may comprise a 120 ohm device while the resistor 66 may comprise a 390 ohm device. Capacitor 68 may be 100 pf.

The output of the parallel connected Schmitt trigger inverters 72 are coupled through a capacitor 74 and series connected resistor 76 to the base terminal of NPN avalanche transistor 78, as shown. Avalanche transistor 78 has its emitter terminal coupled to input 54 at circuit ground. The output of Schmitt trigger inverter 64 is coupled through capacitor 80 and series connected resistor 82 to the base terminal of PNP pre-bias transistor 84. The emitter terminal pre-bias transistor 84 is coupled back to the base terminal thereof through resistor 86. The emitter terminal of transistor 84 defines a node 88 which is coupled to circuit ground through capacitor 90, as shown. In a preferred embodiment, capacitor 74 may have a value of 10 nf, resistor 76 a value of 10 ohms, and transistor 78 may be conveniently furnished as a relatively inexpensive ZTX415 device. In like manner, capacitor 80 may have a value of 2 nf while resistor 82 has a value of 56 ohms. Transistor 84 may be conveniently furnished as a FMMT591 device while resistor 86 has a value of 100 ohms. Capacitor 90 may have a value of 0.1 uf.

Node 88 is also coupled to ground input 54 through capacitor 92. Input 58 is connected to node 88 through series connected resistors 94, 98, having the node therebetween coupled to input 54 through capacitor 96. In a preferred embodiment, capacitors 92 and 96 may have values of 10 uf while resistors 94 and 98 have a value of 47 ohms. Node 88 is also coupled through resistor 100 to node 102 which, in turn, is coupled to input 56 through resistor 104. Resistor 100 may have a value of 470 ohms while resistor 104 may have a value of 120 ohms. Schottky diode 106 has its anode coupled to ground input 54 and its cathode coupled to node 102, as well as the anode of Schottky diode 108 which, in turn, has its cathode coupled to node 88. Schottky diodes 106 and 108 may be conveniently furnished as BAT54S devices.

Parallel connected capacitors 110 couple the emitter terminal of PNP transistor 84 to circuit ground, as shown, and may comprise individual 0.1 uf devices. An additional input 112 is coupled through series connected resistors 114 and 116 to the collector terminal of avalanche transistor 78, as shown. Resistor 114 may have a value of 100K ohms and resistor 116 has a value of 1.0 ohm.

Resistor 118 and series connected capacitor 120 connect node 102 to the anode of Schottky diode 126 with Schottky diode 128 having its cathode connected to circuit ground at input 54. Resistor 118 may have a value of 470 ohms while capacitor 120 may have a value of 100 pf. Schottky diodes 126, 128 may be conveniently furnished as MBR0540 devices. The anode of Schottky diode 126 is coupled to ground input 54 through resistor 124, as well as directly to the collector terminal of PNP transistor 84. As shown, the emitter terminal of NPN transistor 78 is connected to ground input 54 while the base terminal thereof is coupled through resistor 132 to ground input 54. A capacitor 130 couples the anode of Schottky diode 126 to the node between resistors 114 and 116. A laser diode 122, (or other conventional light emitting diode as will be more fully described hereinafter) has its anode coupled to ground input 54 and its cathode coupled to the anode of Schottky diode 126. In a preferred embodiment, resistors 124 and 132 may have a value of 47 and 100 ohms respectively while capacitor 130 has a value of 10 nf.

In operation, the pre-biasing circuit 50 comprises a transistor avalanche circuit including transistor 78 which has its collector terminal coupled to a source of high voltage from input 112 through series connected resistors 114 and 116. The high voltage input 112 may be, for example, between 200 volts to 300 volts or greater. Capacitor 130 couples the node intermediate the resistors 114 and 116 to the cathode of the laser or light emitting diode 122. Resistor 124 and a clamping circuit comprising series connected Schottky diodes 126 and 128 complete the primary elements of the transistor avalanche circuit.

In general, a transistor avalanche circuit functions by charging a capacitor (such as capacitor 130) to a high positive potential. Placing a signal at the base of the avalanche transistor (such as transistor 78) causes it to turn on and function as a switch allowing current to flow out of the capacitor and through the light emitting device (such as diode 122). However, the collector current in the avalanche transistor requires an indeterminate initial build-up delay of anywhere between 2 and 15 nanoseconds before 1-2 amps of current can begin to flow followed by a relatively much smaller additional time before an avalanche condition is reached at about 40 amps. Moreover, this 2-15 nanosecond operating region is highly temperature dependent. When used in conjunction with an LED which itself exhibits an inherent emission lag time, unacceptably high delay and uncertainty as to operation can occur in conventional avalanche circuits in a precision instrument.

Nevertheless, the advantages of using an avalanche transistor to switch power through a laser diode in such a manner are its inherently low component cost and relatively fast operation. However, as previously described, for a period of its initial operating region it functions primarily as a normal amplifying transistor before to entering into the avalanche breakdown region. The delay time prior to entering this region of operation is a function of the transistor base drive current, temperature and the operating voltage and it can be seen that the closer the avalanche transistor can be brought to the inherent breakdown region, the shorter the indeterminate zone prior to avalanche.

With respect to pre-biasing circuit 50, the transistor 78 functions as a dedicated avalanche transistor and the ZTX415 device used in the embodiment shown is relatively inexpensive. The switching characteristics of avalanche transistor 78 are strongly influenced by the base drive signal. In general, the largest base drive current combined with the shortest current rise time produce the shortest delay to the avalanche conduction mode and the fastest rise time of the avalanche conduction mode. The parallel connected Schmitt trigger inverters 72 provide over 100 ma of drive current through resistor 76 in less than 1 nanosecond which produces a very fast transition to the avalanche conduction mode. Resistor 132 provides a current path to ground so that the avalanche transistor 78 can turn off after the charge storage capacitor 130 has been discharged. Resistor 124 provides a current return path during the charging of capacitor 130 and maintains a zero voltage across laser diode 122 until the circuit is "fired".

Schottky diode 126 and 128 serve a dual function. The first function is to conduct a pre-bias current sourced by transistor 84 so that the reverse bias on laser diode 122 is less than the reverse breakdown voltage. The pre-bias clamping voltage at node 93 is typically 1 volt while the reverse breakdown voltage is at least 3 volts. The second function of diode 126 and 128 is to clamp any transient voltage across the laser diode 122 that occurred when the circuit is fired. These transients are caused by the combined effect of the circuit inductance and the charge storage capacitor 130. Resistor 116 is of a relative small value and is used to shape the current pulse that flows through laser diode 122.

A negative transitioning "fire" pulse is input to the pre-biasing circuit 50 on input 52 and is applied through resistor 60 to the input of Schmitt trigger inverter 62, which generates a delay of on the order of 5 nanoseconds. The resultant positive going transition at the output of Schmitt trigger inverter 62 is then applied to the input of Schmitt trigger inverter 64 which also has an inherent gate delay of about 5 nanoseconds. The negative going output signal from Schmitt trigger inverter 64 is then applied to the base of the transistor 84 which then turns it on. Transistor 84 has an inherent turn-on delay of approximately 50 nanoseconds so the total delay to the input "fire" pulse at input 52 through Schmitt trigger inverters 62, 64 and transistor 84 is a total of approximately 60 nanoseconds.

At this point, current through the clamping circuit comprising Schottky diodes 126 and 128 peaks out in a range of about 2 amps in a direction from capacitor 130 to circuit ground. Two series connected Schottky diodes 126 and 128, each rated at about 40 volts, are utilized due to the fact that the forward voltage swing on the diode 122 is about 60 volts when the clamping circuit is reverse biased.

The output of Schmitt trigger inverter 62 can be seen to also be applied to a delay circuit comprising resistor 66 and capacitor 68 which adds an approximately 40 nanosecond delay to the signal that is also applied to the input of Schmitt trigger inverter 64 in the pre-biasing portion of the pre-bias circuit 50. Schmitt trigger inverter 70 adds an additional 5 nanosecond delay and logic inversion for input to the three parallel-connected Schmitt trigger inverters 72. Collectively, the three parallel-connected Schmitt trigger inverters 72 add an additional 5 nanosecond signal delay and increase base drive current to the transistor 78. As a consequence, the turn-on of the avalanche transistor 78 begins at about 55 nanoseconds following the receipt of a "fire" pulse on input 52 while the turn-on of transistor 84 is completed approximately 60 nanoseconds thereafter. The full turn-on of avalanche transistor 78 includes an additional delay of approximately 8 to 10 nanoseconds before it hits avalanche, which then occurs substantially concurrently with the 60 nanosecond timing of the pre-biasing elements at the peak of the approximately 2 amp reverse current through the Schottky diodes 126 and 128.

In essence, the pre-bias circuit 50 functions to turn on the pre-bias transistor 84, which directly controls current of a controlled magnitude in a direction opposite to the primary forward current sufficient to overcome the undesired switching characteristics of the avalanche transistor 78 or other primary switching device. In conjunction with the very fast acting Schottky diode clamping circuit comprising, for example, diodes 126 and 128, when the magnitude of the primary forward current exceeds that of the pre-bias reverse current, the current through diodes 126 and 128 drops to zero abruptly. In other words, the clamping circuit snaps off. The primary forward current now flows through laser diode 122, producing the laser pulse. This transition to forward conduction occurs extremely rapidly, in a few tens to hundreds of pico-seconds, far faster than the avalanche transistor 78 can reach the avalanche conduction mode. The magnitude of the pre-bias reverse current, typically 2 amps, is set to be significantly greater than the current flowing through avalanche transistor 78 before the avalanche conduction mode is reached.

In operation, this then serves to eliminate the temperature and base drive dependent uncertainty zone of the avalanche transistor 78 and move the operating point closer to the avalanche region resulting in a transistor 78 effective turn-on time in the range of a few hundred picoseconds.

Stated another way, the function of the pre-biasing circuit 50 in conjunction with an otherwise conventional avalanche circuit is to place a pre-bias, on the order of 2 amps, in a very high speed clamping circuit comprising, for example, the pair of Schottky diodes 126 and 128 shown. In essence, the pre-biasing technique disclosed serves to eliminate the uncertainly zone in a conventional avalanche transistor* circuit and the current is fully switched into the diode 122 with the speed of the Schottky diode clamping circuit in a sub-nanosecond timeframe.

The pre-bias circuit 50 of the present invention improves the performance of an avalanche or other silicon controlled rectifier ("SCR") laser "fire" circuit and provides an overall improvement in the accuracy of using a laser diode in a laser based distance measurement and ranging instrument by removal of any uncertainty as to when the actual firing point occurs. Moreover, the pre-bias circuit 50 provides additional benefits when an LED is used as diode 122 because even though this uncertainty zone might be below the emission threshold of a typical laser diode, it is not below that of an LED, which fact serves to add additional level of uncertainty to the start of the emission point of the LED. In fact, when a current pulse is applied to an LED, the emission zone, while highly repeatable, is time, temperature and device dependant and much more difficult for which to compensate.

It is desirable to be able to take as a reference point in determining the time of flight of an optical pulse the midpoint of the current waveform zero timing reference rather than having to use an optical reference to determine emission pulse timing. By effectively eliminating the usual build-up current in a transistor avalanche circuit (which is, in practice, completely variable) an LED may then also be utilized in an accurate and precision distance measurement and ranging instrument that is extremely low cost. The pre-bias circuit and technique disclosed makes the best use of an SCR or avalanche device in high precision applications, especially in use with an LED in lieu of a laser diode.

Further, their utilization is not regulated by Federal Food and Drug Administration ("FDA") laser regulations and the power point setting is less critical allowing use of a much lower cost drive circuit components. By contrast, in the utilization of a laser diode, the power point must be carefully trimmed in order to achieve regulatory compliance.

In practice, LED pulses of less than 20 nanoseconds may be achieved utilizing the pre-bias circuit 50 disclosed despite specifications for the devices listing at least 50 nanosecond rise times. As a consequence, the pre-bias circuit 50 when used in conjunction with an LED for diode 122 may be used in industrial sensor and infrared "tape measure" applications. An LED is a more rugged and relatively larger optical source than a laser diode, which generally results in some difficulty in focusing the light source into a narrow beam. However, since the cost of a typical LED is in the range of $0.60–$0.70 each as opposed to that of a laser diode in the range of from $7.00 to up to $50.00 each, there are applications, such as the aforementioned industrial sensors and "tape measure" applications, where a broader beam width on the order of 1°–4° is acceptable. However, the accuracy of the measurement of distances through the calculation of the time of flight of an LED pulse would not be sufficient without the pre-bias circuit 50 above-described and the rapid application of a 40 amp pulse into an LED device more typically operated at approximately 200 milliamps.

While there have been described above the principles of the present invention in conjunction with specific circuitry and laser based distance measurement and ranging instrument applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

What is claimed is:

1. A circuit for generating a light pulse from a light emitting device, said circuit comprising:
    a first switching device operable for applying a first current level to said light emitting device.
    a clamping device coupled across said light emitting device; and
    a second switching device operable for applying a second opposing current level to said clamping device, said second opposing current level being sufficient to preclude said first current level from being applied through said light emitting device until said first switching device is substantially in a conducting condition.

2. The circuit of claim 1 wherein said first current level is derived from a charge stored in a capacitor in series with said light emitting device and said first switching device.

3. The circuit of claim 1 wherein said clamping device comprises one or more Schottky diodes in parallel with said light emitting device.

4. The circuit of claim 1 wherein said second current level is derived from a charge stored in a capacitor in series with said clamping device and said second switching device.

5. The circuit of claim 1 wherein said first and second switching devices comprise transistors.

6. The circuit of claim 5 wherein said transistors comprise bipolar transistors.

7. The circuit of claim 1 wherein said light emitting device comprise a laser emitting light emitting device.

8. The circuit of claim 1 wherein said light emitting device comprises an LED.

9. The circuit of claim 1 further comprising a resistor coupled in parallel with said light emitting device.

10. The circuit of claim 1 further comprising:
    means for turning off said first and second switching devices to alow said first current to flow through said light emitting device.

11. A method for applying an operating current to a signal emitting device through a switching device comprising the steps of:
    providing a clamping device in parallel with said signal emitting device;
    applying a pre-biasing current to said clamping device in opposition to said operating current, said pre-biasing current being sufficient to preclude said operating current from being applied through said signal emitting device until said switching device is substantially in a conducting condition; and
    turning off said clamping device to allow said operating current to be applied through said signal emitting device when said switching device is substantially in said conducting condition.

* * * * *